United States Patent [19]

Malcolm et al.

[11] 4,363,009
[45] Dec. 7, 1982

[54] L-C FILTER WITH IMPEDANCE TRANSFORMERS

[75] Inventors: Bruce G. Malcolm; Robert E. Binninger, both of Indianapolis, Ind.

[73] Assignee: Wavetek Indiana, Inc., Beech Grove, Ind.

[21] Appl. No.: 147,562

[22] Filed: May 8, 1980

[51] Int. Cl.³ ............... H03H 7/075; H03H 7/09; H03H 7/38
[52] U.S. Cl. .................. 333/177; 333/32; 333/168
[58] Field of Search ............ 333/167, 168, 169, 170, 333/171, 174, 177–180, 32; 330/165, 175, 195–197

[56] References Cited

U.S. PATENT DOCUMENTS

| 2,255,642 | 9/1941 | Artzt | 333/170 |
| 2,525,566 | 10/1950 | Terlecki et al. | 333/169 X |
| 3,060,389 | 10/1962 | Kahn | 333/169 X |

OTHER PUBLICATIONS

Rogers–"The Theory of Electrical Networks in Electrical Communication and Other Fields", MacDonald, London, 1957, pp. 136–139 & title page.

Primary Examiner—Marvin L. Nussbaum
Attorney, Agent, or Firm—Ellsworth R. Roston; Charles H. Schwartz

[57] ABSTRACT

Input signals having a particular impedance in a particular frequency range are provided. A first transformer has at its input a particular impedance in the particular frequency range and provides a change at its output to a second impedance in the particular frequency range. A filter is constructed to receive the signals from the first transformer and is provided with the second impedance in the particular frequency range. When the second impedance is lower than the particular impedance, the operation of the filter at the second impedance is advantageous because the size of the inductances in the filter is significantly reduced without impairing the quality of the inductances or increasing energy losses in the inductances.

A second transformer is constructed to receive the signals from the filter. The second transformer provides the second impedance at its input and provides at its output a change to the particular impedance in the particular frequency range. Means are connected to the second transformer for providing output signals having the particular impedance in the particular frequency range.

16 Claims, 4 Drawing Figures

BANDPASS FILTER

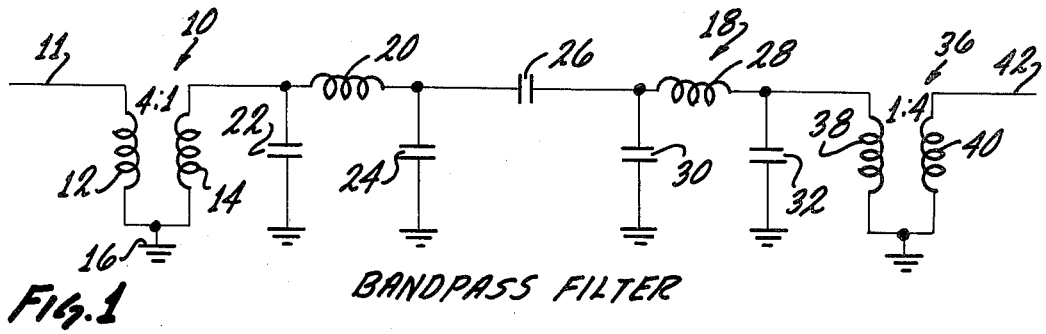
Fig. 1 BANDPASS FILTER
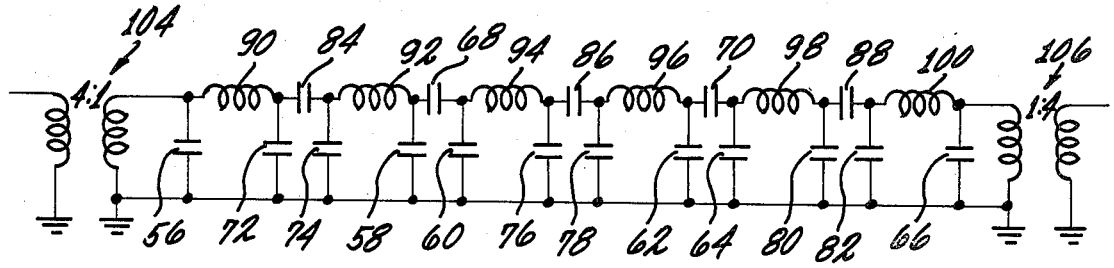
Fig. 2 BANDPASS FILTER
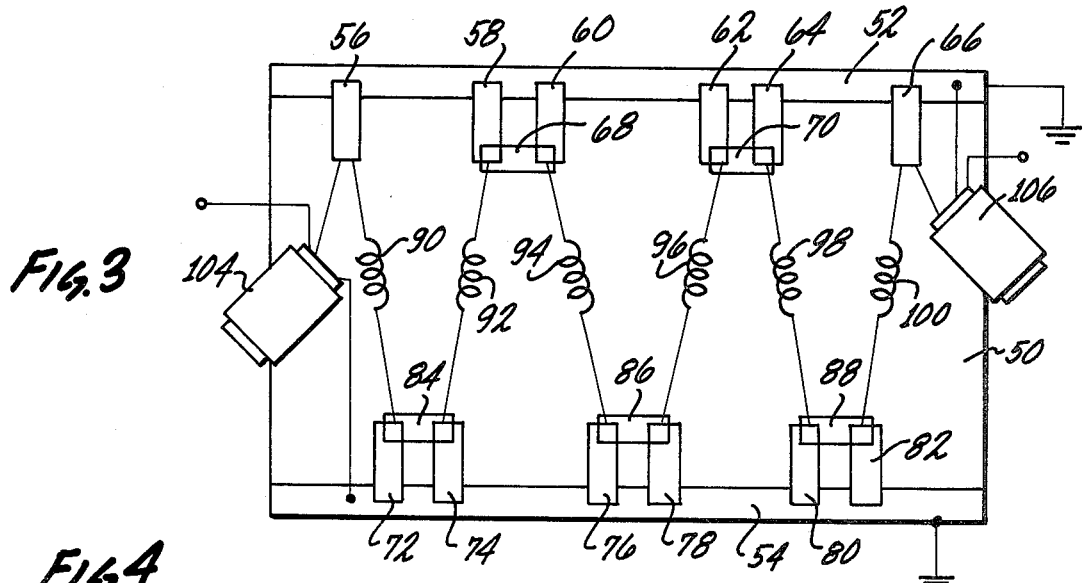
Fig. 3
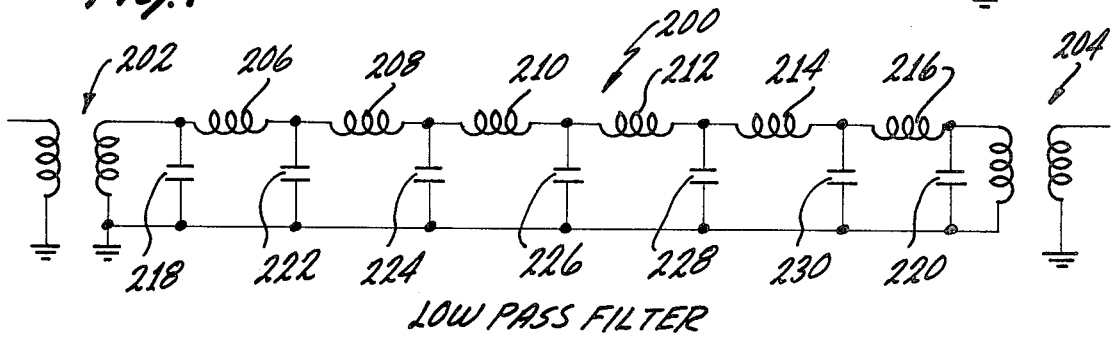
Fig. 4 LOW PASS FILTER

L-C FILTER WITH IMPEDANCE TRANSFORMERS

This invention relates to high frequency filters and more particularly to high frequency filters which occupy a minimal space and provide optimal filtering characteristics in such minimal space. The invention is especially adapted to be used with hybrid or discrete-element integrated circuits operative at frequencies in the tens of megahertz where it is important to minimize the size of components to minimize the size of the integrated circuits while still maintaining the quality of operation of the circuits.

Filters are generally formed from combinations of inductances and capacitances connected to one another in particular relationships. The inductances may be in series and the capacitances may be in parallel with the signal flow. The filters normally provide optimal filtering characteristics in particular frequency ranges. For example, as the frequencies of the signals passed by a filter decrease, the values of the inductances and capacitances tend to increase so that the volume occupied by the filter tends to increase as the frequencies of the signals passed by the filter are reduced. This relationship is expressed mathematically by the expression $$f = \frac{1}{2\pi \sqrt{LC}} ;$$

where f is the band bass or band stop filter center frequency or is related to high pass or low pass 3dB cutoff frequency, L is the inductance, and C is the capacitance.

In recent years the size and weight requirements of radio frequency sources and signal processing components have tended to shrink as a result of integrated circuit technology and the demands of the aerospace industry. It has been difficult to provide filters which occupy a minimal space when signals to be passed are at the low end of the high frequency and ultra high frequency range (3-300 megahertz). For example, it has been difficult to provide, in a range of frequencies between ten (10) megahertz and one hundred and fifty (150) megahertz, filters which will be sufficiently small so that they will have a size compatible with other radio frequency components to which they will be connected. A substantial effort has been made over a considerable number of years to solve this problem but such efforts have not been successful. Such lack of success has resulted to a considerable extent from an inability to provide in small spaces inductances which provide sharply defined ranges of frequencies with minimal energy losses.

This invention provides a system for overcoming the disadvantages discussed above. The system of this invention is able to provide in minimal spaces filters which pass signals at relatively low frequencies with relatively low energy losses. For example, filters are provided by this invention in the range of ten (10) megahertz to one hundred and fifty (150) megahertz in spaces compatible with the sizes of miniature filters currently manufactured to operate above one hundred and fifty (150) megahertz. The system of this invention provides such filters with little loss in efficiency relative to the filters of the prior art and sometimes even with a gain in efficiency relative to such filters.

In the system of this invention, input signals having a particular impedance in a particular frequency range are provided. A first transformer has at its input the particular given input impedance in the particular frequency range and provides a change at its output to a second impedance in the particular frequency range. A filter is constructed to receive the signals from the first transformer and is provided with the second impedance in the particular frequency range. For example, if a transformer having a 4:1 turns ratio between primary and secondary windings is provided, an input impedance of fifty (50) ohms may be converted by the transformer to an impedance of twelve and a half (12.5) ohms.

A second transformer is constructed to receive the signals from the filter. The second transformer provides the second impedance at its input and provides at its output a change to the particular impedance in the particular frequency range. Means are connected to the second transformer for providing output signals having the particular impedance in the particular frequency range. For example, the second transformer may have a 1:4 turns ratio between its primary and secondary windings to convert the impedance from twelve and a half (12.5) ohms to fifty (50) ohms.

The inclusion of the two transformers offers certain advantages. By including the two transformers in the filter to reduce the impedance in the filter, the inductances in the filter are considerably reduced in size without sacrificing in any way the quality of the inductances or increasing any energy losses in such inductances. This reduction in size more than offsets any increase in space from the addition of the two transformers.

In a first embodiment of the invention, the second impedance is less than the particular impedance by a particular proportion. This embodiment has the advantage of providing in a minimal space optimal filtering in the particular frequency range without any loss in the quality of the filter or any increase in the energy losses in the filter. In a second embodiment, the second impedance has a greater impedance than the particular impedance by a particular proportion. This embodiment is advantageous in providing enhanced tuning characteristics in the filter.

In the drawings:

FIG. 1 is a schematic circuit diagram of a band pass filter constituting one embodiment of the invention;

FIG. 2 is a schematic circuit diagram of another band pass filter constituting a second embodiment of the invention;

FIG. 3 is a schematic plan view of the physical interrelationship between the different elements in the filter of FIG. 2; and FIG. 4 is a schematic circuit diagram of a low pass filter constituting a further embodiment of the invention.

FIG. 1 shows a band pass filter which incorporates the advantages of this invention. In the embodiment shown in FIG. 1, a transformer generally indicated at 10 receives signals on a line 11. The transformer 10 is provided with a pair of magnetically coupled windings 12 and 14 having a common reference terminal such as a ground 16. The winding 12 receives on the line 11 a signal at a particular impedance, such as approximately fifty (50) ohms at a particular frequency such as approximately ten (10) megahertz to one hundred and fifty (150) megahertz. The resultant signal produced at the output of the winding 14 is transformed to a reduced impedance, such as twelve and one half (12.5) ohms, in this frequency range. This is accomplished by providing the windings 12 and 14 with a turns ratio of 4:1. In other words, the winding 12 has approximately four (4) times as many turns as the winding 14.

The transformer 10 may be constructed in any of several forms dependent upon the frequency range over which it operates. For example, the windings may be magnetically coupled as by twisting or by a bifilar interrelationship in conjunction with a magnetic core. The method of winding the primary winding 12 and the secondary winding 14 in a magnetically coupled relationship may provide some control over the frequency bandwidth of the signals passed by the transformer.

The secondary winding 14 is connected to a filter generally indicated at 18. The filter may be formed from a plurality of inductors in series and a plurality of capacitors connected across the inductors. For example, the winding 14 may be connected to an inductor 20. A capacitor 22 may be connected from the input terminal of the inductor 20 to the reference such as ground and a capacitor 24 may be connected from the output terminal of the inductor to the reference terminal. The inductor 20 may be in series with a capacitor 26, which couples the filter section described above to a similar filter section defined by an inductor 28 and capacitors 30 and 32.

The filter 18, consisting of the two sections described above, is constructed to pass signals in a particular frequency band as will be described in detail subsequently. Additional stages corresponding to the stage 18 may be included. These stages may be provided with characteristics corresponding to those of the stage 18 or they may be provided with slightly different frequency characteristics to sharpen the band of frequencies passed by the filter. The inclusion of additional stages to provide enhanced filtering techniques is well known in the art. Furthermore, it will be appreciated that other types of filters than that shown in FIG. 1 and designated as 18 may be used.

When the filter 18 is used, a transformer generally indicated at 36 receives the signals on the terminal common to the inductor 28 and the capacitor 32. The transformer 36 includes a primary winding 38 and a secondary winding 40. The transformer 36 may be provided with a turns ratio to provide a change of impedances in an inverse proportion to that provided by the transformer 10. For example, when the transformer 10 provides a change of impedances from a value of approximately fifty (50) ohms on the primary winding to a value of approximately twelve and one half (12.5) ohms on the secondary winding, the transformer 36 is constructed to provide a change of impedances from a value of approximately twelve and one half (12.5) ohms on the primary winding to a value of approximately fifty (50) ohms on the secondary winding. The signals produced on the secondary winding 40 pass through an output line 42 to subsequent components. This is accomplished by providing the transformer 36 with a turns ratio of substantially 1:4 between the primary and secondary windings.

The transformer 36 may be constructed in a manner similar to that described above for the transformer 10. However, the transformer 36 does not have to be constructed in a manner similar to that provided for the transformer 10. For example, the transformer 10 may be provided with a different number of turns on its primary and secondary windings than that respectively provided for the secondary and primary windings in the transformer 36. It is desirable, however, that the proportion of the turns in the primary and secondary windings of the transformer 10 be inversely related to the proportion of the number of turns in the primary and secondary windings of the transformer 36. Furthermore, the transformer 36 does not have to be provided with the same magnetic coupling as the transformer 10. For example, the transformer 10 may be constructed from bifilar windings and the transformer 36 may be constructed from a twisted pair.

The filter 18 described above may be considered as being formed from two similar stages which are coupled by the capacitor 26. One of these stages may be considered to include the capacitors 22 and 24 and the inductor 20 and the other stage may be considered to include the capacitors 30 and 32 and the inductor 28. Each of these stages functions to pass signals having only a particular frequency range. As a result, the filter 18 described above has bandpass characteristics and passes signals only in an intermediate range between high and low frequencies. By way of illustration, the signals of intermediate frequencies for a particular filter may be in the range of approximately ten (10) megahertz to approximately one hundred and fifty (150) megahertz.

Particularly when the signals have a frequency approaching ten (10) megahertz, the inductors 20 and 28 may be so large (without the inclusion of the transformers 10 and 36) that the package formed by the filter 18 tends to dwarf the electrical circuitry to which the filter is connected. Alternatively, the inductors 20 and 28 may be reduced in size (without the inclusion of the transformers 10 and 36) but the energy losses in the inductors may be excessive and the quality of response of the inductors may be poor.

By including the transformers 10 and 36, the values of the inductors 20 and 28 can be reduced by a factor of four (4) without increasing the energy loss in the inductors. This corresponds to a change in impedance in the transformer from fifty (50) ohms at the input side to twelve and one half (12.5) ohms at the output side. This represents a considerable reduction in space for the package formed by the filter 18 even though the values of the capacitors have to increase by a factor of four (4) and even though the transformers 10 and 36 are included in the package. This results from the fact that the decrease in the size of the inductors with the inclusion of the transformers is considerably greater than the increase in the size of the capacitors as a result of the inclusion of the transformers. Thus, even when the transformers 10 and 36 are included in the package, the total size of the package is considerably smaller than if the transformers 10 and 36 were not included.

The advantages of the filter of this invention may be seen in part from the following well-known equation:

$$f = \frac{1}{2\pi\sqrt{LC}}, \text{ where}$$

where
f = the frequency of a resonant section;
L = the inductance of the resonant section; and
C = the capacitance of the resonant section.
As will be seen, either the inductance or the capacitance of the resonant section has to be increased in order for the resonant frequency of the section to be decreased. Furthermore, $$Z = \sqrt{L/C}, \text{ where}$$

where
Z = the impedance of the resonant section.
This equation indicates that the inductance of the resonant section may be reduced as the impedance of the section is reduced. Thus, the inductance can be considerably reduced in size by reducing the impedance of the resonant section.

The advantages obtained by the filter of this invention may be seen from a different perspective. For example, in order to maintain the size of the filter 18 within particular limits without including the transformers 10 and 36, the Q (quality) of the filter would have to be considerably reduced. However, by including the transformers 10 and 36, the Q (quality) of the filter can be maintained at high levels. This provides for sharp frequency responses in the filter with minimal energy losses. This enhancement in the quality of the filter far outweighs any deterioration in such quality by the inclusion of the transformers 10 and 36 and the resultant losses in the transformers.

Without the transformers 10 and 36, the capacitors 22 and 30 may have values of 530 picofarads; the capacitors 24 and 32 may have values of 160 picofarads; the capacitor 26 may have a value of 20 picofarads; and the inductors 20 and 28 may have values of 3.0 microhenries. With the transformers 10 and 36, the value of each capacitor is increased by a factor of four (4) and the value of each inductor may be decreased by a factor of four (4). All of the above is based on a frequency of approximately ten (10) megahertz.

The discussion above has proceeded on the basis of the construction of a filter which passes signals at a relatively low frequency such as approximately ten (10) megahertz. It may sometimes be desirable to include the transformers 10 and 36 when high frequency signals such as frequencies of one hundred and fifty (150) megahertz and even higher frequencies are to be passed by the filter. For example, under such circumstances, the transformer 10 may be constructed to provide an increase in the impedance approximately from fifty (50) ohms to two hundred (200) ohms and the transformer 36 may be constructed to provide a decrease in impedance from two hundred (200) ohms to fifty (50) ohms. Under such circumstances, the value of the inductances in the filter is increased and the value of the capacitances is decreased relative to the values of these components without the inclusion of the transformers. Increases in the value of the inductances in a filter may be desirable because such increases enhance the ease of tuning the inductances.

FIGS. 2 and 3 illustrate an arrangement in which the different windings in input and output transformers and the different inductances and capacitances in a filter may be disposed to provide optimal performance characteristics in a composite package. In the embodiment shown in FIGS. 2 and 3, a board 50 is provided with two strips 52 and 54 at its opposite ends. The strips 52 and 54 may be connected to reference terminals such as ground. Shunt capacitors 56, 58, 60, 62, 64 and 66 may have one terminal connected to the reference strip 52. The capacitors 58 and 60 may be connected to opposite ends of a capacitor 68 and the capacitors 62 and 64 may be connected to opposite ends of a capacitor 70.

Similarly, shunt capacitors 72, 74, 76, 78, 80 and 82 may have one terminal connected to the reference strip 54. The other terminals of the capacitors 72 and 74 may be connected to opposite ends of a capacitor 84; the other terminals of the capacitors 76 and 78 may be connected to opposite ends of a capacitor 86; and the other terminals of the capacitors 80 and 82 may be connected to opposite ends of a capacitor 88.

Inductances 90, 92, 94, 96, 98 and 100 may also be disposed on the board 50. The inductance 90 may be connected between the capacitance 56 and the terminal common to the capacitances 72 and 84. Similarly, the inductance 92 may be connected between the terminal common to the capacitances 74 and 84 and the terminal common to the capacitances 58 and 68. Connections may similarly be provided for the inductance 94 between the terminal common to the capacitances 60 and 68 and the terminal common to the capacitances 76 and 86. The inductances 96 and 98 may respectively be in series with the capacitances 86 and 70 and the capacitances 70 and 88. The inductance 100 may be connected between the capacitance 66 and the terminal common to the capacitances 82 and 88.

A transformer 104 may be connected between the reference strip 54 and the capacitance 56. Similarly, a transformer 106 may be connected between the reference strip 52 and the capacitance 66. The transformer 104 may provide either an increase in impedance or a decrease in impedance as described above. The transformer 106 may provide a change in impedance in inverse relationship to that provided by the transformer 104 so that the impedance at the output of the transformer 106 corresponds to the impedance at the input of the transformer 104.

The arrangement shown in FIGS. 2 and 3 may be considered to include six (6) filtering stages since six (6) inductances are included. Such an arrangement operates in a manner similar to that described above for the embodiment shown in FIG. 1 except that additional filtering is provided by the additional stages provided in the embodiment shown in FIGS. 2 and 3. The embodiment of FIGS. 2 and 3 is advantageous in that it provides for a packaging of the filter in a minimal space. Furthermore, the embodiment provides a symmetrical relationship which facilitates ease of assembly of the different components.

FIG. 4 illustrates a low pass filter, generally indicated at 200, which incorporates the feature of this invention. The low pass filter may include a transformer, generally indicated at 202, at its input end and also may include a transformer, generally indicated at 204, at its output end. The filter may include a plurality of inductances 206, 208, 210, 212, 214 and 216 in series and may further include capacitances 218 and 220 respectively connected across the secondary winding of the transformer 202 and the primary winding of the transformer 204. Capacitances 222, 224, 226, 228 and 230 may be respectively connected to the terminals common to the inductances 206 and 208, the inductances 208 and 210, the inductances 210 and 212, the inductances 212 and 214 and the inductances 214 and 216.

The low pass filter of FIG. 4 has substantially the same advantages as the band pass filters described above. For example, when the impedance in the filter is reduced by the operation of the transformer 202, the inductances become decreased in value (and size) without any loss in the quality of the inductances and without any increase in energy losses in the inductances. The reduction in the size of the inductances is significantly greater in volume than any increase in the size of the capacitances even when added to the size of the transformers.

It will be appreciated that this invention may be used in other types of filters than low pass or band pass filters as described above. For example, the invention may also be used in high pass and band stop filters without departing from the scope of the invention.

Although this application has been disclosed and illustrated with reference to particular applications, the principles involved are susceptible of numerous other applications which will be apparent to persons skilled in the art. The invention is, therefore, to be limited only as indicated by the scope of the appended claims.

We claim:

1. In combination for use in a particular range of frequencies between 3 megahertz and 300 megahertz to minimize size,
   a filter having input and output terminals and having an impedance of a particular value at the input and output terminals in the particular range of frequencies and including a plurality of inductances and capacitances connected to provide a passage of signals in the particular range of frequencies,
   a first transformer connected to the input terminal of the filter and providing, in the particular range of frequencies, a particular change in impedance to the particular value from a particular input value above the particular value, and
   a second transformer connected to the output terminal of the filter and providing an impedance change, inverse to the particular change, in the particular range of frequencies from the particular value to the input value of the first transformer.

2. The combination set forth in claim 1 wherein
   the first transformer is constructed to provide an impedance drop of a particular proportion from the particular input value to the particular value in the particular range of frequencies and the second transformer is constructed to provide an impedance increase of the particular proportion from the particular value to the particular input value of the first transformer in the particular range of frequencies and the inductances are decreased in size from their size with impedances at the particular input value.

3. The combination set forth in claim 2 wherein
   the first transformer includes first and second windings wound relative to each other to provide the impedance drop of the particular proportion in the particular range of frequencies and the second transformer includes first and second windings wound relative to each other to provide the impedance increase of the particular inverse proportion in the particular range of frequencies.

4. In combination for use in a particular range of frequencies between 3 megahertz and 300 megahertz,
   means for providing input signals having a particular impedance in the particular frequency range,
   a first transformer having in the particular frequency range a particular input impedance corresponding to the particular impedance and providing a change to a second impedance lower than the particular input impedance in the particular frequency range,
   a filter constructed to receive the signals from the first transformer and having the second impedance in the particular frequency range and constructed to pass signals only in the particular frequency range,
   a second transformer constructed to recieve the signals from the filter and to provide an input impedance in the particular frequency range corresponding to the second impedance and to provide a change to the particular impedance in the particular frequency range, and
   means connected to the second transformer for providing output signals having the particular impedance in the particular frequency range.

5. The combination set forth in claim 4 wherein
   the filter is formed from a plurality of inductances and capacitances connected to one another to pass the signals only in the particular frequency range and the particular frequency range has bandpass characteristics.

6. The combination set forth in claim 4 wherein
   the first transformer is provided with at least a pair of windings and the first winding in the pair is provided with the particular impedance in the particular frequency range and the second winding in the pair is provided with the second impedance in the particular frequency range and
   the second transformer is provided with at least a pair of windings and the first winding in the pair is provided with the second impedance in the particular frequency range and the second winding is provided with the particular impedance in the particular frequency range.

7. The combination set forth in claim 6 wherein
   the filter is formed from a plurality of inductances and capacitances connected to one another to pass the signals only in the particular frequency range and the particular frequency range has bandpass characteristics and the inductances have smaller sizes at the second impedance than they would have if they were at the particular impedance and such reduction in size in the inductances is greater than the cumulative size of the first and second transformers.

8. The combination set forth in claim 7 wherein
   the inductances are in series and the capacitances are in parallel across the inductances.

9. The combination set forth in claim 8 wherein
   a capacitance is in series with each pair of inductances.

10. The combination set forth in claim 9 wherein
    the pair of windings in each of the first and second transformers is in a magnetically coupled relationship.

11. The combination set forth in claim 6 wherein
    the second impedance is greater by a particular proportion than the input impedance.

12. In combination for use in a particular frequency range between 3 megahertz and 300 megahertz,
    means providing an input signal at a particular impedance in the particular frequency range,
    first means providing a transformation in the particular frequency range of the impedance from the particular impedance to a second impedance lower than the particular impedance,
    a filter connected to the first means and operative at the second impedance in the particular frequency range, and second means connected to the filter and providing a transformation of the impedance from the second impedance to the particular impedance in the particular frequency range.

13. The combination set forth in claim 12 wherein the filter is formed from at least a pair of inductances and capacitances connected to one another to pass signals only in the particular frequency range and the difference between the size of the filter at the second impedance and the size of a filter at the particular impedance is greater than the combined sizes of the first and second transformers.

14. The combination set forth in claim 13 wherein the filter has band pass characteristics.

15. The combination set forth in claim 13 wherein the filter has low pass characteristics.

16. The combination set forth in claim 12 wherein each of the first and second means has band pass characteristics.

* * * * *